United States Patent [19]

Muto et al.

[11] Patent Number: 5,115,124
[45] Date of Patent: May 19, 1992

[54] SEMICONDUCTOR PHOTOSENSOR HAVING UNITARY CONSTRUCTION

[75] Inventors: Kazuhiko Muto, Kawasaki; Takahiro Shirai, Hiratsuka; Tsunenori Yoshinari, Tokyo, all of Japan

[73] Assignee: Canon Kabushiki Kaisha, Tokyo, Japan

[21] Appl. No.: 666,458

[22] Filed: Mar. 5, 1991

Related U.S. Application Data

[63] Continuation of Ser. No. 480,361, Feb. 14, 1990, abandoned, which is a continuation of Ser. No. 357,634, May 24, 1989, abandoned, which is a continuation of Ser. No. 208,858, Jun. 14, 1988, abandoned, which is a continuation of Ser. No. 15,930, Feb. 18, 1987, abandoned.

[30] Foreign Application Priority Data

Feb. 8, 1986 [JP] Japan .................. 61-044788
Feb. 28, 1986 [JP] Japan .................. 61-044787

[51] Int. Cl.⁵ .................................... H01V 40/14
[52] U.S. Cl. ........................... 250/214 L; 356/223
[58] Field of Search ............ 250/211 R, 211 J, 214 L, 250/208.2, 214 R, 214 A; 356/218, 223, 226; 357/30 G

[56] References Cited

U.S. PATENT DOCUMENTS

| | | | |
|---|---|---|---|
| 3,535,532 | 10/1970 | Merryman | 357/30 G |
| 3,745,424 | 7/1973 | Ohuchi et al. | 357/30 G |
| 4,183,034 | 1/1980 | Burke et al. | 357/30 G |
| 4,199,753 | 4/1980 | Gontowski, Jr. | 356/223 |
| 4,266,237 | 5/1981 | Hendrickson | 357/41 |
| 4,346,395 | 8/1982 | Ouchi | 357/30 |
| 4,389,534 | 6/1983 | Winterling | 136/256 |
| 4,488,038 | 12/1984 | Harrison et al. | 250/211 J |
| 4,523,217 | 6/1985 | Jibu | 357/43 |
| 4,625,225 | 11/1986 | Goodfellow et al. | 357/30 |
| 4,636,829 | 1/1987 | Greenwood | 357/30 |
| 4,651,016 | 3/1987 | Hirao | 250/578 |
| 4,719,498 | 1/1988 | Wada et al. | 357/30 G |

FOREIGN PATENT DOCUMENTS

| | | | |
|---|---|---|---|
| 59-27104 | 7/1984 | Japan . | |
| 61-250529 | 11/1986 | Japan | 250/214 L |

OTHER PUBLICATIONS

Marx et al.; Integrated Optical Detector Array, Waveguide, and Modulator Based on Silicon Technology; IEEE Journal of Solid-State Circuits, vol. SC-12, No. 1; Feb.'77; pp. 10–13.

Tietze, U. & Schener, C. *Halbleiter-Schaltungstechnik* (5th ed. 1980) pp. 207–208.

Sebko et al., "Photoamplifier having dynamic compensation of the temperature drift of the d-c component of photodetectors," Sov. J. Opt. Technol., 46(8), pp. 486–487 (Aug. 1979).

Dereniak et al., "Low-noise preamplifier for photoconductive detectors," Rev. Sco. Instrum., vol. 48, No. 4, pp. 392–394 (Apr. 1977).

Schade, "A new generation of MOS/bipolar operational amplifiers," RCA Review, vol. 37, pp. 404–424 (Sep. 1976).

*Primary Examiner*—David C. Nelms
*Attorney, Agent, or Firm*—Fitzpatrick, Cella, Harper & Scinto

[57] ABSTRACT

A semiconductor photo-sensor comprising a photo-sensor area for converting an optical signal to an electrical signal, and a signal processing circuit for processing the electrical signal. The photo-sensor area and the signal processing circuit are formed on one semiconductor substrate.

11 Claims, 5 Drawing Sheets

SEMICONDUCTOR PHOTOSENSOR HAVING UNITARY CONSTRUCTION

This application is a continuation of application Ser. No. 07/480,361, field Feb. 14, 1990, which is a continuation of application Ser. No. 357,634, filed May 24, 1989, which is a continuation of application Ser. No. 208,858, filed June 14, 1988, which is a continuation of application Ser. No. 015,930, filed Feb. 18, 1987, all now abandoned.

BACKGROUND OF THE INVENTION

1. Field of the Invention

The present invention relates to a semiconductor photo-sensor used for a light intensity detection device, and more particularly to a semiconductor photo-sensor which uses a semiconductor photo-sensor as a photo-sensor.

2. Related Background Art

In many prior art semiconductor photo-sensors, photo-conductive elements are used as photo-sensors because they provide a large output, do not need amplifiers and can be produced with a low manufacturing cost. The conductivity of photo-conductive element changes with light illumination, and the change is converted to a current or a voltage for signal processing.

However, the photo-conductive element has a low sensitivity and 0.1-1 lux is a limit for measurement. Since a photo-sensor needs a relatively large area, it is difficult to measure an illumination of a small spot area having dimensions such as several hundreds microns because of this low sensitivity or because of low S/N ratio.

A semiconductor photo-sensor which converts an optical signal to an electric signal comprises a photo-sensor and a signal processing circuit and is constructed according to one of the following two methods.

One construction comprises a single photo-sensor of a relatively large area and a signal processing circuit formed on one semiconductor substrate. The other construction has a plurality of divided photo-sensors formed on one or more semiconductor substrates and signal processing circuits for the photo-sensors formed on other semiconductor substrate, the substrates being connected by wire bonding.

In the former construction, since the optical signal for different positions of a detection plane of the photo-sensor are averaged, it is difficult to simultaneously detect two different optical signals simultaneously applied to different positions on the detection plane, and the effect of external light is large when the optical signal is applied to a portion of the detection plane. In the latter construction, the number of semiconductor substrates increases, packaging area, increases, signal current leaks from the bonding area and the sensitivity is lowered.

SUMMARY OF THE INVENTION

It is an object of the present invention to provide a semiconductor photo-sensor which resolves the problems encountered in the prior art semiconductor photo-sensor.

It is another object of the present invention to provide a semiconductor photo-sensor which can detect a lower illumination than the prior art semiconductor photo-sensor could detect It is another object of the present invention to provide a semiconductor photo-sensor which is more compact than the prior art semiconductor photo-sensor and which can detect an optical signal applied to a small area.

It is a further object of the present invention to provide a semiconductor photo-sensor which has a high sensitivity detection characteristic and significantly improves package density.

It is another object of the present invention to provide a semiconductor photo-sensor which has a photo-sensor for converting an optical signal to an electrical signal and a signal processing circuit for processing the electrical signal, formed on one semiconductor substrate.

It is another object of the present invention to provide a semiconductor photo-sensor which has a plurality of photo-sensors for converting optical signals to electrical signals and signal processing circuits, one for each of the photo-sensors, for processing the electrical signals, formed on one semiconductor substrate. By the plurality of photo-sensors means the plurality of photo-sensor areas formed by dividing one photo-sensor into the plurality of areas.

DETAILED DESCRIPTION OF THE PREFERRED EMBODIMENTS

An illumination meter which embodies the semiconductor photo-sensor of the present invention as a light intensity measurement device is explained.

Figure 1:
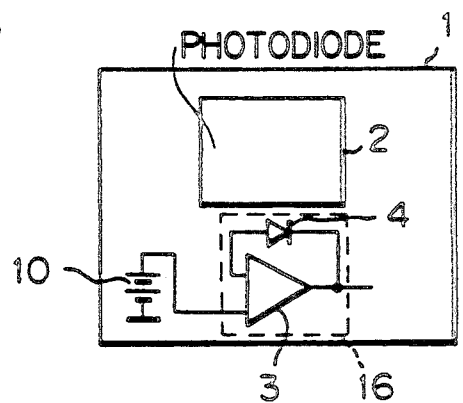
FIG. 1 shows a layout of a photo-sensor of an illumination meter in accordance with a first embodiment of the invention.

FIG. 1 shows a layout of a photo-sensor of a first embodiment of the illumination meter.

Figure 2:
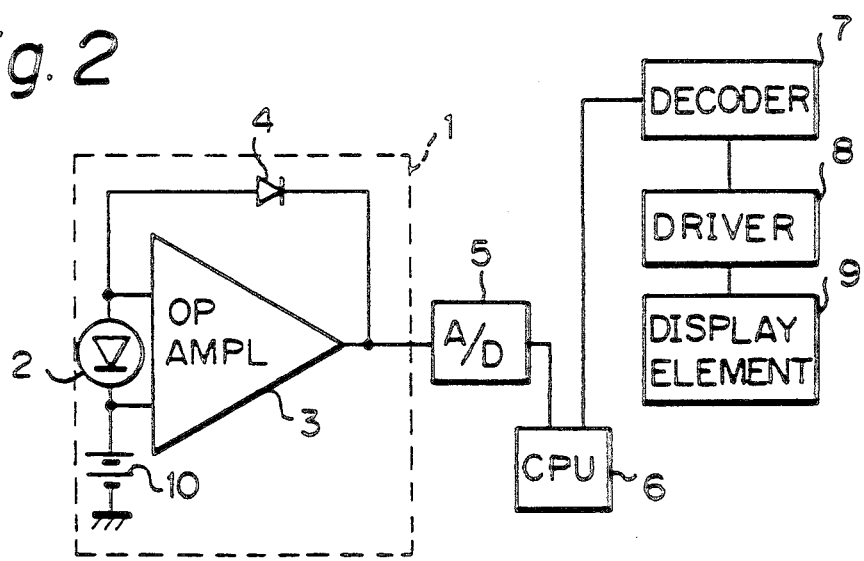
FIG. 2 shows a block diagram of a drive circuit of the illumination meter of the first embodiment.

FIG. 2 shows a block diagram of a drive circuit of the first embodiment of the illumination meter.

In FIG. 1, numeral 1 denotes a semiconductor substrate, numeral 2 denotes a semiconductor photo-sensor (photo-diode) formed on the semiconductor substrate 1, numeral 4 denotes a log diode and numeral 3 denotes an operational amplifier. The log diode 4 is connected to an inverting input terminal and an output terminal of the operational amplifier to form a log amplifier 16. The photodiode 2 is connected to an input terminal of the operational amplifier 3.

As shown in FIG. 2, a photo-current generated by the irradiation of the light to the photo-diode 2 is current-to-voltage converted by the log diode 4 and it is applied to the log amplifier 16. The output level thereof is set by a reference voltage source 10. Since the photodiode and the processing circuit are formed on the same semiconductor substrate, the photo-current generated by the irradiation of the light does not leak but flows into the log diode 4. Accordingly, sensitivity is improved and light on the order of 0.001 lux can be measured. The photo-sensor does not need a large area but several hundreds μm square is sufficient. The output from the log amplifier 16 is converted to a digital signal by the A/D converter 5 and it is processed by the CPU 6 and the result is supplied to the decoder 7. The output of the decoder 7 is connected to the driver 8, and the incident light intensity is displayed by the display device 9 which is driven by the driver 8.

Figure 3:
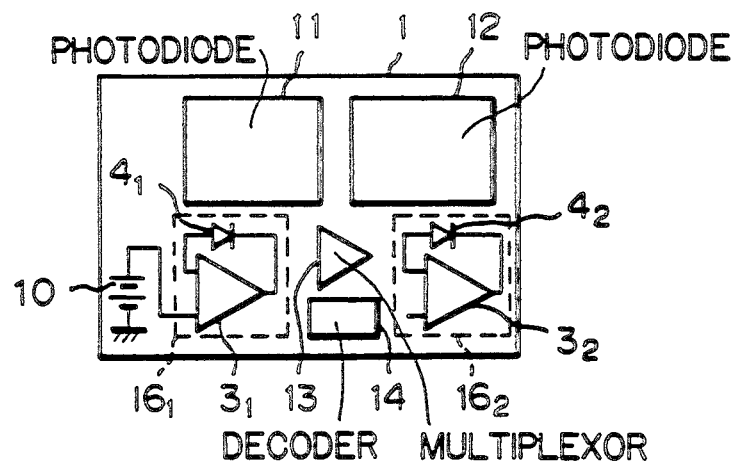
FIG. 3 shows a layout of a photo-sensor of an illumination meter of a second embodiment.

FIG. 3 shows a layout of a photo-sensor of an illumination meter in accordance with a second embodiment.

Figure 4:
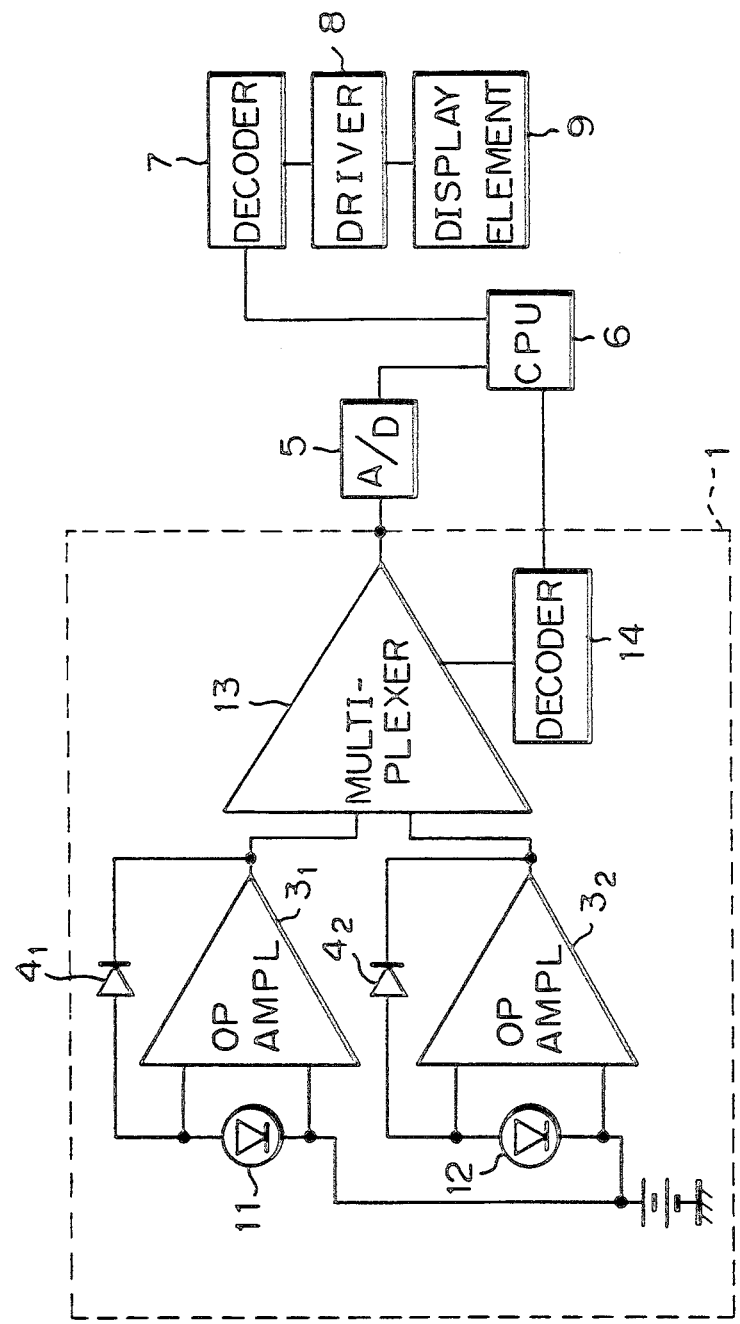
FIG. 4 shows a block diagram of a drive circuit of the illumination meter of the second embodiment.

FIG. 4 shows a block diagram of a drive circuit of the illumination meter of the second embodiment.

In the second embodiment, two photo-sensors of the first embodiment are provided. Elements similar to those shown in FIGS. 1 and 2 are designated by the like numerals.

In FIG. 3, photo-diodes 11 and 12 are arranged side by side on the semiconductor substrate 1. Numeral 13 denotes a multiplexor and numeral 14 denotes a decoder.

As shown in FIG. 4, photo-currents generated by the irradiation of the light to the photo-diodes 11 and 12 are supplied to the multiplexor 13 through the log amplifiers $16_1$ and $16_2$ comprising the log diodes $4_1$ and $4_2$ and the operational amplifiers $3_1$ and $3_2$, respectively. The multiplexor 13 is controlled by the channel select signal supplied from the decoder 14 so that a required channel is selected. The channel select signal is controlled by a control signal supplied from the CPU 6 through the decoder 14. The other operation is same as that described in connection with the first embodiment and the explanation thereof is omitted. Any number of photo-sensors may be used and any shape of photo-sensor may be used.

The illumination meter of the present embodiment can measure illumination at two points. Since the additional photo-diode and signal processing circuit can be formed on the semiconductor substrate, a compact illumination meter can be designed. The illumination meter of the present invention can be applied to an evaluation and light intensity measurement device of a camera.

Another application of the photo-sensor shown in FIG. 1 will now be explained.

Figure 5:
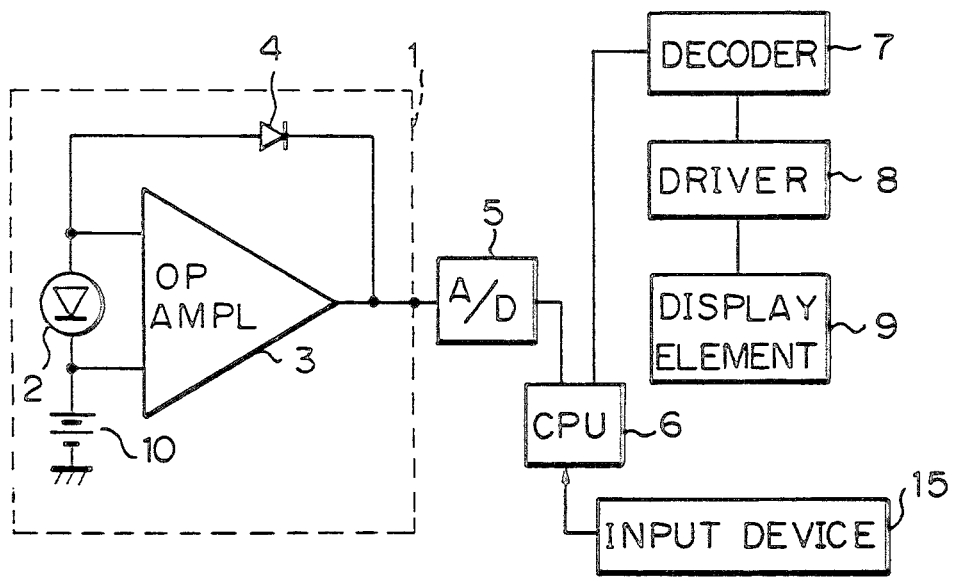
FIG. 5 shows a block diagram of a drive circuit of an exposure meter.

FIG. 5 shows a block diagram of a drive circuit of an exposure meter.

A basic configuration is same as that of the drive circuit of the illumination meter shown in FIG. 2. Only the differences are explained.

In FIG. 5, a digital signal converted by the A/D converter 5 is supplied to the CPU 6. On the other hand, a voltage signal representing an EV value is supplied to the CPU 6 from an input device 15, and it is compared with a signal from the A/D converter 5 corresponding to the incident light intensity, and a differential signal is supplied to the decoder 7.

In accordance with the present embodiment, the semiconductor photo-sensor is used as the photo-sensor, and the photo-sensor and the signal processing circuit are formed on the same semiconductor substrate so that a low illumination light can be detected and the photo-sensor can be of small area. Thus, an optical signal applied to a small area can be detected. Where a plurality of photo-sensors are provided, the additional photo-diodes and signal processing circuits may be formed on the semiconductor substrate so that a compact light intensity measurement device can be designed.

Figure 6:
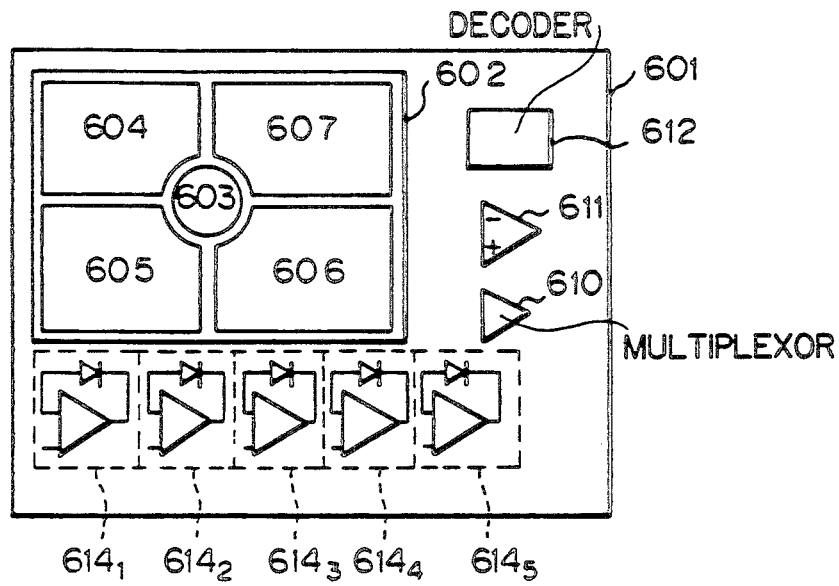
FIG. 6 shows a layout of a third embodiment of the semiconductor photo-sensor of the present invention.

FIG. 6 shows a layout of a third embodiment of the present invention.

Figure 7:
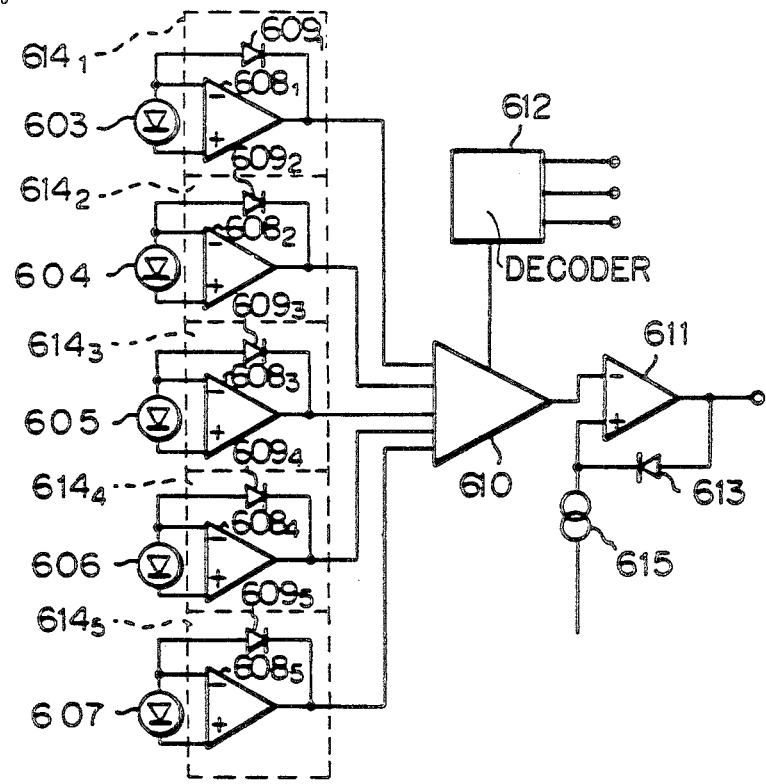
FIG. 7 shows a block diagram of a signal processing circuit of the third embodiment.

FIG. 7 shows a block diagram of a signal processing circuit of the third embodiment.

In FIG. 6, numeral 601 denotes a semiconductor substrate, and numeral 602 denotes a photo-sensor formed in the semiconductor substrate. It may be a photo-diode or photo-transistor. The photo-sensor 602 comprises five photo-sensor areas 603–607. Those photo-sensor areas are connected to log amplifiers $614_1$–$614_5$ comprising operational amplifiers $608_1$–$608_5$ and log diodes $609_1$–$609_5$, as shown in FIG. 7. Photo-currents generated in the photo-sensor areas 603–607 by the irradiation of light are current-voltage converted by the log diodes $609_1$–$609_5$. The outputs of the log amplifiers $614_1$–$614_5$ are supplied to a multiplexor 610 which selects a channel in accordance with a signal from a decoder 612. The output of the selected log amplifier is supplied to a buffer amplifier 611. Numeral 613 denotes a diode for compensating a dark current of the log diode and numeral 615 denotes a reference current source for setting an output voltage level. In the present embodiment, since the photo-sensor is divided into five photo-sensor areas, individual optical signals applied to the photo-sensor areas can be detected and the signal detection precision can be improved.

The number of divisions and the shape of the photo-sensor may be set arbitrarily.

Figure 8:
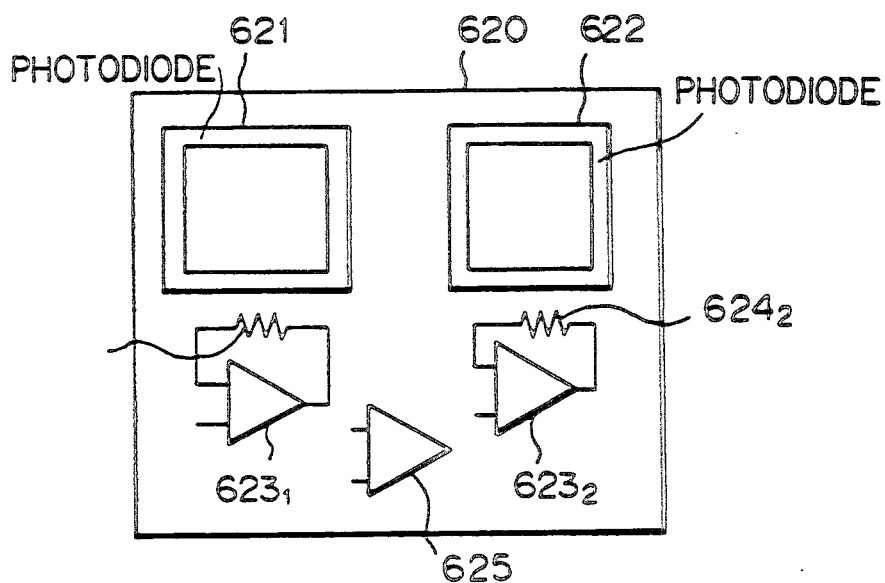
FIG. 8 shows a layout of a fourth embodiment of the semiconductor photo-sensor of the present invention.

FIG. 8 shows a layout of a fourth embodiment of the semiconductor photo-sensor of the present invention.

Figure 9:
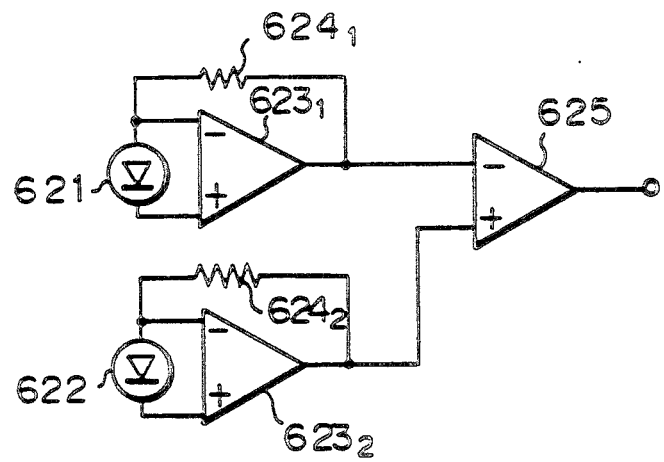
FIG. 9 shows a block diagram of a signal processing circuit of the fourth embodiment.

FIG. 9 shows a block diagram of a signal processing circuit of the present embodiment.

In FIG. 8, numeral 620 denotes a semiconductor substrate, and numerals 621 and 622 denote photo-sensor areas formed on the semiconductor substrate, which are isolatedly arranged at different areas on the semiconductor substrate 620. As shown in FIG. 9, photo-sensor areas 621 and 622 are connected to input terminals of operational amplifiers $623_1$ and $623_2$ to which current-voltage conversion resistors $624_1$ and $624_2$ are connected. Photo-currents generated in the photo-sensor areas 621 and 622 by the irradiation of light are current-voltage converted by the resistors $624_1$ and $624_2$. The outputs of the operational amplifiers $623_1$ and $623_2$ are supplied to a differential operational amplifier 625 which amplifies a difference between the output voltages of the operational amplifiers $623_1$ and $623_2$.

In the present embodiment, the two photo-sensor areas are isolatedly arranged to allow detection of optical signals at different positions. The signal processing circuit such as differential operational amplifier 625 is arranged between the two photo-sensor areas to improve the package density.

The number and shape of the photo-sensor areas may be arbitrarily selected.

In accordance with the embodiments shown in FIGS. 6 to 9, one photo-sensor is divided into a plurality of areas or a plurality of photo-sensor areas are isolatedly arranged so that each photo-sensor area detects the optical signal to provide a high sensitivity detection characteristic. Since the photo-sensor areas and the signal processing circuit for the photo-sensor areas are formed on one semiconductor substrate, the package density is improved and a low cost and compact semiconductor photo-sensor is provided.

We claim:

1. A semiconductor photo-sensor comprising:
    a plurality of photo-sensors for converting an optical signal an electrical signal;
    a signal processing circuit for processing the electrical signals of the respective photo-sensors comprising:
    a plurality of logarithmic amplifiers each having an input and an output for amplifying the electrical signals of the respective photo-sensors, each of the logarithmic amplifiers including an operational amplifier and a logarithmic diode;
    a multiplexer electrically connected to the outputs of said logarithmic amplifiers; and
    decoder for supplying a signal to control said multiplexor,
    said photo-sensors and said signal processing circuit being formed on one semiconductor substrate.

2. A semiconductor photo-sensor according to claim 1, wherein:
    each photo-sensor is located on a predetermined area of said semiconductor substrate; and
    said plurality of photo-sensors comprises five photo-sensors, one of the photo-sensors being in an area which is surrounded by another four of said photo-sensor areas.

3. A semiconductor photo-sensor according to claim 1, wherein the logarithmic amplifiers are arranged in an array.

4. A device comprising:
    a semiconductor photosensor according to claim 1; and
    an external circuit for processing output from said signal processing circuit of said semiconductor photosensor.

5. A device according to claim 4 wherein said external circuit comprises a display element for displaying information indicative of processed output from said signal processing circuit.

6. A device according to claim 4, wherein said device as in illumination meter.

7. A device according to claim 4, wherein said device is an exposure meter.

8. A device according to claim 5, wherein said device is an illumination meter.

9. A device according to claim 5, wherein said device is an exposure meter.

10. A semiconductor photo-sensor comprising:
    a plurality of photo-sensors each being formed on a predetermined area of one semiconductor substrate for converting an optical signal to an electrical signal;
    a signal processing circuit for processing the electrical signal of the respective photo-sensors, comprising:
    a plurality of amplifiers for amplifying the electrical signal of the respective photo-sensors, each of the amplifiers including an operational amplifier and a resistor for converting a current to a voltage; and
    a differential amplifier for amplifying a difference between the output voltages of said operational amplifiers wherein said signal processing circuit is formed on said semiconductor substrate.

11. A semiconductor photo-sensor according to claim 10, wherein said differential amplifier is positioned between said photo-sensor areas.

* * * * *

UNITED STATES PATENT AND TRADEMARK OFFICE
CERTIFICATE OF CORRECTION

PATENT NO. : 5,115,124
DATED : May 19, 1992
INVENTOR(S) : KAZUHIKO MUTO ET AL.

It is certified that error appears in the above-indentified patent and that said Letters Patent is hereby corrected as shown below:

On the title page:

AT [30] FOREIGN APPLICATION PRIORITY DATA

"Feb. 8, 1986 [JP] Japan ........ 61-044788" should read --Feb. 28, 1986 [JP] Japan ........ 61-044788--.

AT [56] REFERENCES CITED

Other Publications,
under Marx et al., "IEEE Joutnal" should read --IEEE Journal--.
under Dereniak et al., "Rev. Sco. Instrum.," should read --Rev. Sci. Instrum.,--.

COLUMN 1

Line 6, "field" should read --filed--.
Line 32, "hundreds microns" should read --hundreds of microns--.
Line 66, "detect" should read --detect.--.

COLUMN 2

Line 20, "means" should read --we also mean--.
Line 41, "invention." should read --invention,--.

COLUMN 5

Line 18, "plexor," should read --plexer,--.
Line 31, "the" should read --said--.
Line 34, "photosensor" should read --photo-sensor--.

UNITED STATES PATENT AND TRADEMARK OFFICE
CERTIFICATE OF CORRECTION

PATENT NO. : 5,115,124
DATED : May 19, 1992
INVENTOR(S) : KAZUHIKO MUTO ET AL.        Page 2 of 2

It is certified that error appears in the above-identified patent and that said Letters Patent is hereby corrected as shown below:

<u>COLUMN 6</u>

Line 4, "claim 4" should read --claim 4,--.
    Line 9, "as in" should read --is an--.

Signed and Sealed this

Second Day of November, 1993

Attest:

BRUCE LEHMAN

Attesting Officer        Commissioner of Patents and Trademarks